US012676591B2

(12) United States Patent　　　(10) Patent No.: US 12,676,591 B2
　　　Yamane　　　(45) Date of Patent: Jul. 7, 2026

(54) ACOUSTIC WAVE DEVICE

(71) Applicant: Murata Manufacturing Co., Ltd.,
　　　　　　　Nagaokakyo (JP)

(72) Inventor: Takashi Yamane, Nagaokakyo (JP)

(73) Assignee: MURATA MANUFACTURING CO.,
　　　　　　　LTD, Kyoto (JP)

( * ) Notice: Subject to any disclaimer, the term of this
　　　　　　patent is extended or adjusted under 35
　　　　　　U.S.C. 154(b) by 78 days.

(21) Appl. No.: 18/657,882

(22) Filed: May 8, 2024

(65) Prior Publication Data

US 2024/0291465 A1　　Aug. 29, 2024

Related U.S. Application Data

(63) Continuation of application No.
　　　PCT/JP2022/041922, filed on Nov. 10, 2022.

(60) Provisional application No. 63/278,146, filed on Nov.
　　　11, 2021.

(51) Int. Cl.
　　　*H03H 9/05*　　　　(2006.01)
　　　*H03H 9/02*　　　　(2006.01)

(52) U.S. Cl.
　　　CPC ...... *H03H 9/0514* (2013.01); *H03H 9/02015*
　　　　　　　　　　　　　　　　　　　(2013.01)

(58) Field of Classification Search
　　　CPC .. H03H 9/0514; H03H 9/02015; H03H 9/059;
　　　　　　　H03H 9/1071; H03H 9/1085; H03H 9/17;
　　　　　　　　　　　　　　　　　　　　　　H03H 9/25
　　　USPC ................................................. 333/193–196
　　　See application file for complete search history.

(56) References Cited

U.S. PATENT DOCUMENTS

| | | |
|---|---|---|
| 2010/0142089 A1 | 6/2010 | Suzuki |
| 2012/0205754 A1 | 8/2012 | Iwamoto |
| 2013/0057360 A1 | 3/2013 | Meltaus et al. |
| 2014/0152145 A1 | 6/2014 | Kando et al. |
| 2015/0008789 A1 | 1/2015 | Iwamoto |

(Continued)

FOREIGN PATENT DOCUMENTS

| | | |
|---|---|---|
| JP | 2010102768 A | 5/2010 |
| JP | 2010166371 A | 7/2010 |

(Continued)

OTHER PUBLICATIONS

International Search Report in PCT/JP2022/041922, mailed Jan. 31,
2023, 4 pages.

(Continued)

*Primary Examiner* — Jorge L Salazar, Jr.
(74) *Attorney, Agent, or Firm* — Keating & Bennett, LLP

(57) ABSTRACT

An acoustic wave device includes an acoustic wave element,
bumps electrically connected to the acoustic wave element,
an under-bump metal layer between the acoustic wave
element and the bumps, a wiring substrate on which the
acoustic wave element is mounted, and an encapsulating
body covering the acoustic wave element on the wiring
substrate. The acoustic wave element includes a support
substrate, a piezoelectric layer on one main surface of the
support substrate, and a functional electrode on at least one
main surface of the piezoelectric layer. The wiring substrate
is electrically connected to the acoustic wave element via the
under-bump metal layer and the bumps. The piezoelectric
layer includes a hole passing through the piezoelectric layer
on at least a portion of a straight line connecting the
functional electrode and the bumps to each other.

17 Claims, 13 Drawing Sheets

10

(56)                    References Cited

U.S. PATENT DOCUMENTS

| | | |
|---|---|---|
| 2018/0013404 A1 | 1/2018 | Kawasaki et al. |
| 2019/0140615 A1 | 5/2019 | Fujiya et al. |
| 2019/0181828 A1 | 6/2019 | Iwamoto |
| 2021/0265972 A1 | 8/2021 | Daimon |
| 2024/0014800 A1* | 1/2024 | Inoue ................. H03H 9/02228 |

FOREIGN PATENT DOCUMENTS

| | | | |
|---|---|---|---|
| JP | 2012257019 A | 12/2012 | |
| JP | 2013528996 A | 7/2013 | |
| JP | 2019106698 A | 6/2019 | |
| WO | 2011052551 A1 | 5/2011 | |
| WO | 2012073871 A1 | 6/2012 | |
| WO | 2013146374 A1 | 10/2013 | |
| WO | 2016208287 A1 | 12/2016 | |
| WO | 2018003819 A1 | 1/2018 | |
| WO | 2020100744 A1 | 5/2020 | |

OTHER PUBLICATIONS

Written Opinion in PCT/JP2022/041922, mailed Jan. 31, 2023, 5 pages.

* cited by examiner

REGION OF FORMULA 2

REGION OF FORMULA 3

REGION OF FORMULA 1

REGION OF FORMULA 2

ACOUSTIC WAVE DEVICE

CROSS REFERENCE TO RELATED APPLICATIONS

This application claims the benefit of priority to Provisional Application No. 63/278,146 filed on Nov. 11, 2021 and is a Continuation Application of PCT Application No. PCT/JP2022/041922 filed on Nov. 10, 2022. The entire contents of each application are hereby incorporated herein by reference.

BACKGROUND OF THE INVENTION

1. Field of the Invention

The present invention relates to acoustic wave devices.

2. Description of the Related Art

Conventionally, an acoustic wave device including a piezoelectric layer made of lithium niobate or lithium tantalate is known.

Japanese Unexamined Patent Application Publication No. 2012-257019 discloses an acoustic wave device including a support body including a hollow portion, a piezoelectric substrate provided on the support body to overlap the hollow portion, and an interdigital transducer (IDT) electrode provided on the piezoelectric substrate to overlap the hollow portion, in which the IDT electrode excites a plate wave and the peripheral edge portion of the hollow portion does not include a straight line portion that extends parallel to the propagation direction of the plate wave excited by the IDT electrode.

International Publication No. 2013/146374 discloses a structure in which a plurality of acoustic wave elements are mounted on a mounting substrate by using a flip chip bonding method.

In the acoustic wave device described in International Publication No. 2013/146374, when the acoustic wave elements are mounted on the mounting substrate via bumps, a crack may occur in portions of the piezoelectric layer disposed directly under the bumps due to pressure or impact during mounting, and the crack may extend to an excitation portion including functional electrodes.

SUMMARY OF THE INVENTION

Example embodiments of the present invention provide acoustic wave devices in each of which an excitation portion including functional electrodes is less likely to be damaged when acoustic wave elements are mounted.

An acoustic wave device according to an example embodiment of the present invention includes an acoustic wave element, a plurality of bumps electrically connected to the acoustic wave element, an under-bump metal layer between the acoustic wave element and the bumps, a wiring substrate on which the acoustic wave element is mounted, and an encapsulating body covering the acoustic wave element on the wiring substrate. The acoustic wave includes element a support substrate, a piezoelectric layer on one main surface of the support substrate, and a functional electrode on at least one main surface of the piezoelectric layer. The wiring substrate is electrically connected to the acoustic wave element via the under-bump metal layer and the bumps. The piezoelectric layer includes a hole passing through the piezoelectric layer on at least a portion of a straight line connecting the functional electrode and the bumps to each other.

According to example embodiments of the present invention, it is possible to provide acoustic wave devices in each of which an excitation portion including functional electrodes is less likely to be damaged when acoustic wave elements are mounted.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Acoustic wave devices according to example embodiments of the present invention will be described below with reference to the drawings.

In an acoustic wave device according to an example embodiment of the present invention, the piezoelectric layer includes a hole passing through the piezoelectric layer on at least a portion of a straight line connecting functional electrodes and bumps to each other. Accordingly, the growth of a crack in the piezoelectric layer produced during mounting can be reduced or prevented at the hole. As a result, an excitation portion including the functional electrodes is less likely to be damaged.

In the first, second, and third aspects of the present invention, an acoustic wave device according to example embodiments of the present invention include a piezoelectric layer that is made of, for example, lithium niobate or lithium tantalate and first electrodes and second electrodes that face each other in a direction intersecting the thickness direction of the piezoelectric layer.

In the first aspect, for example, a bulk wave of a thickness-shear mode, such as a first thickness-shear mode, is used. In the second aspect, for example, when first and second electrodes are adjacent to each other, d is the thickness of the piezoelectric layer, and p is the center-to-center distance between first and second electrodes, d/p is about 0.5 or smaller. As a result, in the first and second aspects, the Q value can be increased even when downsizing is achieved.

In the third aspect, for example, a Lamb wave is used as a plate wave. In addition, resonance characteristics of the Lamb wave can be obtained.

In a fourth aspect, an acoustic wave device according to an example embodiment of the present invention includes the piezoelectric layer made of, for example, lithium niobate or lithium tantalate and an upper electrode and a lower electrode that face each other in the thickness direction of the piezoelectric layer with the piezoelectric layer therebetween. In the fourth aspect, a bulk wave is used.

The present invention will be clarified by describing example embodiments of the present invention with reference to the drawings.

The drawings illustrated below are schematic, and the dimensions, the aspect ratios, and the like may differ from those of actual products.

Example embodiments of the present invention described in this specification are exemplary, and the structures of different example embodiments can be partially replaced or combined.

Figure 1:
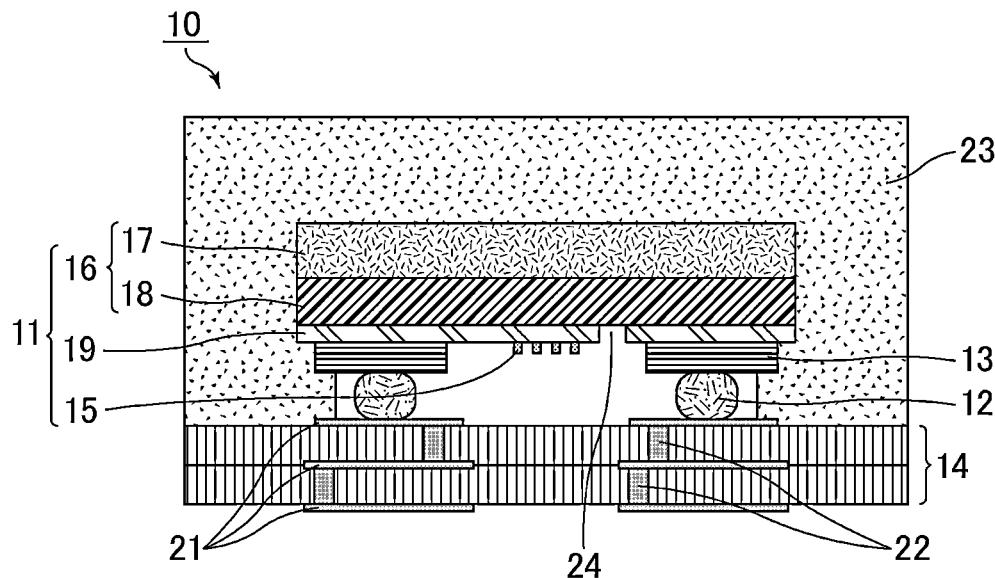
FIG. 1 is a cross-sectional view schematically illustrating an acoustic wave device according to example embodiment 1 of the present invention.

FIG. 1 is a cross-sectional view schematically illustrating an acoustic wave device according to example embodiment 1 of the present invention.

Figure 2:
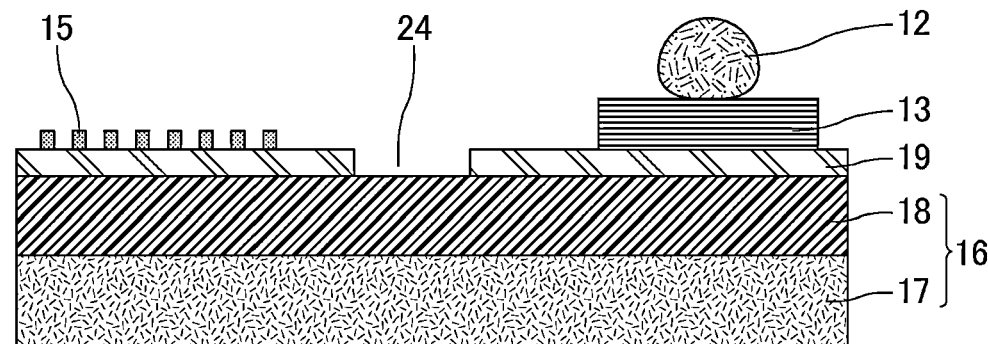
FIG. 2 is a cross-sectional view schematically illustrating a portion of an acoustic wave element 11, an under-bump metal layer 13, and bumps 12 of the acoustic wave device according to example embodiment 1 of the present invention.

FIG. 2 is a cross-sectional view schematically illustrating a portion of an acoustic wave element 11, an under-bump metal layer 13, and bumps 12 of the acoustic wave device according to example embodiment 1 of the present invention.

Figure 3:
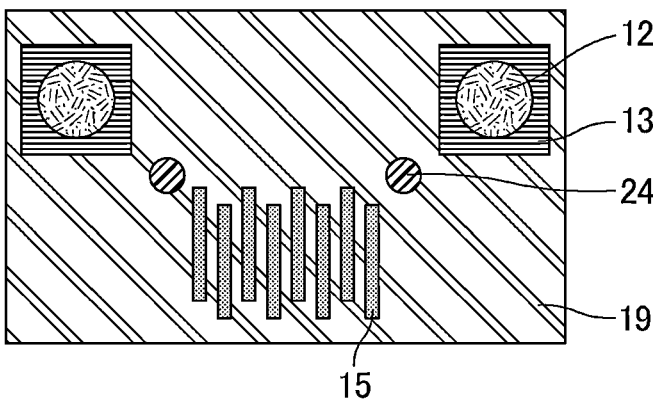
FIG. 3 is a top view schematically illustrating a structure in which the under-bump metal layer 13 and the bumps 12 are connected to the acoustic wave element 11 of the acoustic wave device according to example embodiment 1 of the present invention.

FIG. 3 is a top view schematically illustrating a structure in which the under-bump metal layer 13 and the bumps 12 are connected to the acoustic wave element 11 in the acoustic wave device according to example embodiment 1 of the present invention.

An acoustic wave device 10 illustrated in FIG. 1 includes the acoustic wave element 11, the bumps 12 electrically connected to the acoustic wave element 11, the under-bump metal layer 13 provided between the acoustic wave element 11 and the bumps 12, the wiring substrate 14 on which the acoustic wave element 11 is mounted, and an encapsulating body 23 that covers the acoustic wave element 11 on the wiring substrate 14. The acoustic wave element 11 includes a support substrate 16, a piezoelectric layer 19 provided on one main surface of the support substrate 16, and functional electrodes 15 provided on one main surface of the piezoelectric layer 19. The wiring substrate 14 is electrically connected to the acoustic wave element 11 via the under-bump metal layer 13 and the bumps 12. The piezoelectric layer 19 includes a hole 24 passing through the piezoelectric layer 19 on at least a portion of a straight line connecting the functional electrodes 15 and the bumps 12 to each other.

Although not illustrated, one main surface of the support substrate 16 includes a wiring electrode that is electrically connected to the functional electrodes 15. In addition, the under-bump metal layer 13 is electrically connected to the wiring electrode.

Figure 4:
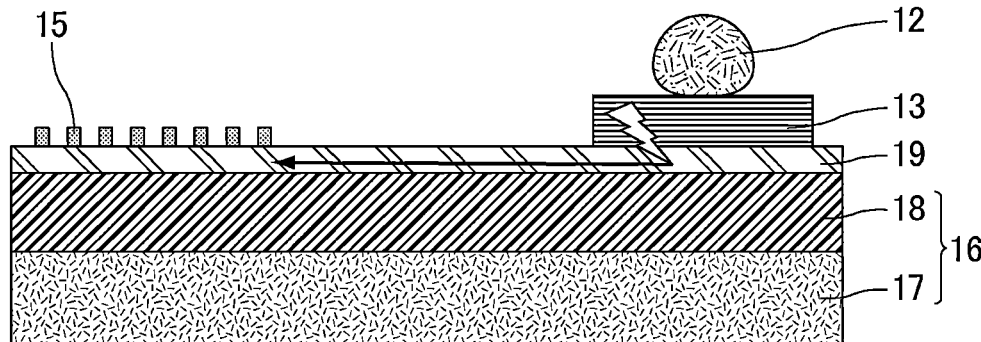
FIG. 4 is a cross-sectional view schematically illustrating a portion of the acoustic wave element 11, the under-bump metal layer 13, and the bumps 12 of an acoustic wave device according to a comparative example.

FIG. 4 is a cross-sectional view schematically illustrating a portion of the acoustic wave element 11, the under-bump metal layer 13, and the bumps 12 of an acoustic wave device according to a comparative example.

When a hole that passes through the piezoelectric layer 19 is not provided on a straight line connecting the functional electrodes 15 and the bumps 12 to each other in the piezoelectric layer 19 as illustrated in FIG. 4, a crack may be produced in the piezoelectric layer 19 disposed directly under the bumps 12 due to pressure or impact when the acoustic wave element 11 is mounted on the wiring substrate 14 via the bumps 12, and the crack may extend to the excitation portion including the functional electrodes 15.

On the other hand, since the piezoelectric layer 19 includes the hole 24 that passes through the piezoelectric layer 19 on at least a portion of the straight line connecting the functional electrodes 15 and the bumps 12 to each other as illustrated in FIG. 2, the growth of a crack in the piezoelectric layer 19 produced during mounting can be reduced or prevented at the hole 24.

The position of the hole 24 is not particularly limited as long as the hole 24 is provided on at least a portion of a straight line connecting the functional electrodes 15 and the bumps 12 to each other, but the hole 24 is preferably provided on a straight line connecting the functional electrodes 15 and the bump 12 closest to the functional electrodes 15 to each other as illustrated in FIG. 3. As a result, the growth of a crack in the piezoelectric layer 19 can be more effectively reduced or prevented.

The number, the shape, and the size of the holes 24 are not particularly limited. When the number of the holes 24 is two or more, for example, the shape and the size of the holes 24 as viewed in a direction in which the support substrate 16 and the piezoelectric layer 19 are laminated together may be the same or different.

The wiring substrate 14 is electrically connected to the acoustic wave element 11 via the under-bump metal layer 13 and the bumps 12. The wiring substrate 14 is, for example, a printed wiring substrate. The coefficient of linear expansion of the printed wiring substrate is about 15 ppm/° C., for example. The printed wiring substrate is formed of a glass cloth/epoxy resin copper-clad laminated substrate, for example.

More specifically, the piezoelectric layer 19 of the acoustic wave element 11 is disposed with the main surface thereof facing the wiring substrate 14. The acoustic wave element 11 is mounted on external terminals 21 of the wiring substrate 14 via the bumps 12.

As a result, a space is provided between one main surface of the piezoelectric layer 19 and the wiring substrate 14. The functional electrodes 15 are provided between one main surface of the piezoelectric layer 19 and the wiring substrate 14.

More specifically, the external terminals 21, the bumps 12, the under-bump metal layer 13, the piezoelectric layer 19, and the support substrate 16 of the acoustic wave element 11 are laminated on the wiring substrate 14 in this order.

The bumps 12 can be made of a metal, such as Au, or an alloy, such as solder, for example. The bumps 12 are preferably made of Au, for example.

The wiring substrate 14 preferably includes vias 22. The vias 22 are provided in the wiring substrate 14. The wiring substrate 14 may include a plurality of external terminals 21, and in this case, preferably, the plurality of external terminals 21 are electrically connected to each other via the vias 22.

The acoustic wave element 11 on the wiring substrate 14 is encapsulated with an encapsulating body 23. The encapsulating body 23 is, for example, preferably a resin, and more preferably a material in which an inorganic filler, such as a metal, is mixed into a resin material, such as an epoxy resin, a silicone resin, a fluororesin, or an acrylic resin.

The piezoelectric layer 19 is made of, for example, lithium niobate ($LiNbO_x$) or lithium tantalate ($LiTaO_x$). In this case, the piezoelectric layer 19 may be made of, for example, $LiNbO_3$ or $LiTaO_3$.

In addition, the piezoelectric layer 19 is preferably made of, for example, a monocrystalline piezoelectric substance. Since a monocrystalline piezoelectric substance is more likely to crack along the crystal cleavage plane during mounting than a polycrystalline piezoelectric substance, the technical significance of example embodiments of the present invention becomes greater.

The monocrystalline piezoelectric substance can be analyzed by an X-ray diffractometer (XRD).

An XRD is a device that evaluates the crystal structure of a sample by irradiating the sample with an X-ray and measuring the diffracted X-ray emitted from the sample. Since the crystal structure can be evaluated, polymorphs with the same chemical formula, such as, for example, quartz, tridymite, cristobalite, and silica glass, which all have chemical formula $SiO_2$, can be distinguished. In addition, the lattice constant and the crystallinity can be evaluated by evaluating the obtained position and width of the peak.

When the piezoelectric layer 19 is made of a monocrystalline piezoelectric substance, a straight line connecting the functional electrodes 15 and bumps 12 to each other is preferably parallel or substantially parallel to the cleavage direction (the direction parallel to the cleavage plane) of the piezoelectric layer 19. This can efficiently prevent a crack from growing along the crystal cleavage planes.

The support substrate 16 may include a hollow portion but need not have a hollow portion.

The support substrate 16 may include a dielectric layer (also referred to as an insulating layer or joint layer) 18 on one main surface on which the piezoelectric layer 19 is provided. For example, the support substrate 16 includes a support 17 and the dielectric layer 18 provided between the support 17 and the piezoelectric layer 19.

The dielectric layer 18 is made of, for example, silicon oxide ($SiO_x$). In this case, the dielectric layer 18 is preferably made of, for example, $SiO_2$. As a result, frequency-temperature characteristics can be further improved.

The material of the dielectric layer 18 is not limited to the material described above and may be, for example, silicon nitride ($Si_xN_y$). In this case, the dielectric layer 18 may be made of, for example, $Si_3N_4$.

The support 17 is made of, for example, silicon (Si). The material of the support 17 is not limited to the material described above and may be, for example, a piezoelectric substance, such as aluminum oxide, lithium tantalate, lithium niobate, or quartz, ceramic, such as alumina, sapphire, silicon nitride, aluminum nitride, silicon carbide, zirconia, cordierite, mullite, steatite, or forsterite, a dielectric, such as diamond or glass, a semiconductor, such as gallium nitride, or a resin.

The under-bump metal layer 13 is made of a metal. The metal includes, for example, at least one of Al, Pt, Au, Ag, Cu, Ni, Ti, Cr, Pd, or alloys mainly including these metals.

Modifications of example embodiment 1 will be described below.

Figure 5:
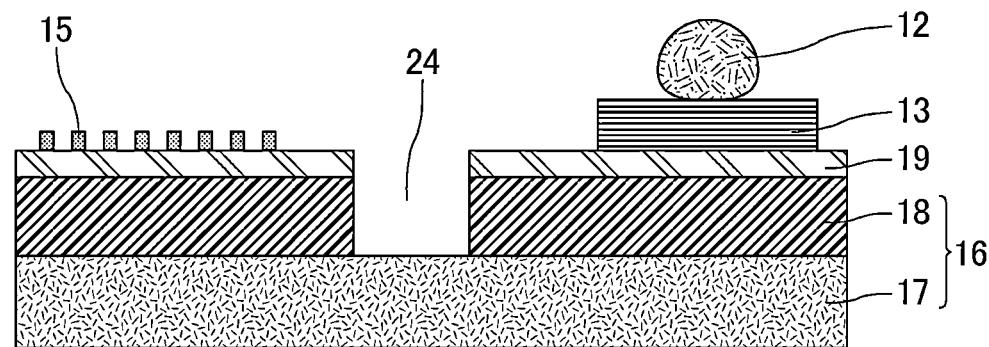
FIG. 5 is a cross-sectional view schematically illustrating a portion of the acoustic wave element 11, the under-bump metal layer 13, and the bumps 12 of an acoustic wave device according to modification 1 of example embodiment 1 of the present invention.

FIG. 5 is a cross-sectional view schematically illustrating a portion of the acoustic wave element 11, the under-bump metal layer 13, and the bumps 12 of an acoustic wave device according to modification 1 of example embodiment 1 of the present invention.

Figure 6:
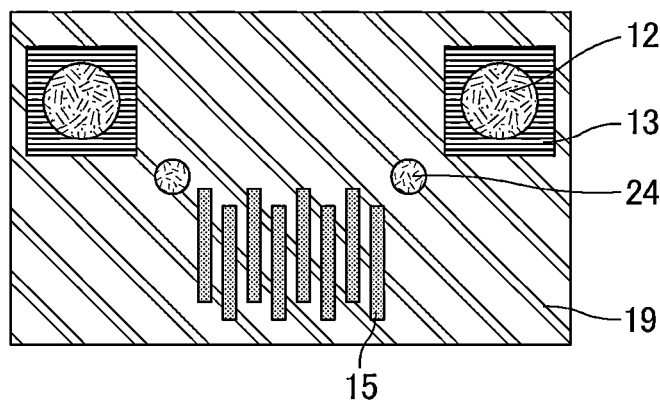
FIG. 6 is a top view schematically illustrating a structure in which the under-bump metal layer 13 and the bumps 12 are connected to the acoustic wave element 11 in the acoustic wave device according to modification 1 of example embodiment 1 of the present invention.

FIG. 6 is a top view schematically illustrating a structure in which the under-bump metal layer 13 and the bumps 12 are connected to the acoustic wave element 11 in the acoustic wave device according to modification 1.

When the support substrate 16 includes the dielectric layer 18, the hole 24 passing through the piezoelectric layer 19 may extend to the dielectric layer 18 of the support substrate 16. As illustrated in FIGS. 5 and 6, for example, the hole 24 passing through the piezoelectric layer 19 may also pass through the dielectric layer 18.

When two or more holes are provided, all of the holes may pass through the dielectric layer, or a hole that passes through the dielectric layer and a hole that extends to midway through the dielectric layer may be mixed. In addition, a hole that passes through only the piezoelectric layer without extending to the dielectric layer may be provided.

Figure 7:
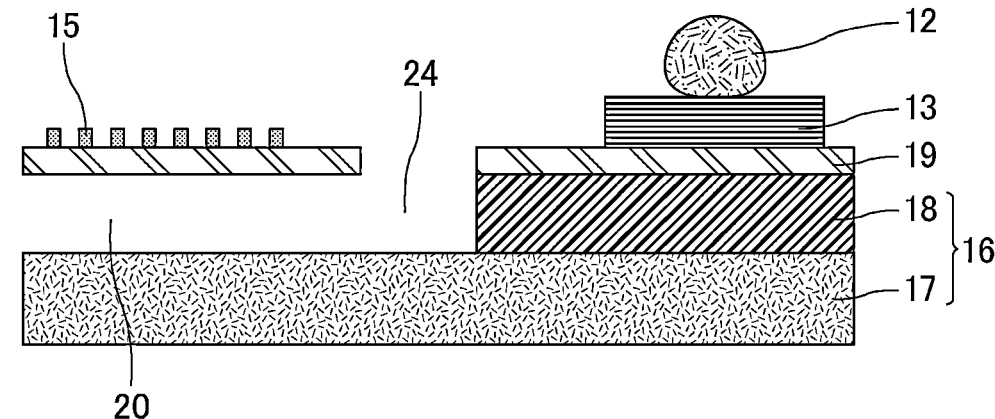
FIG. 7 is a cross-sectional view schematically illustrating a portion of the acoustic wave element 11, the under-bump metal layer 13, and the bumps 12 of an acoustic wave device according to modification 2 of example embodiment 1 of the present invention.

FIG. 7 is a cross-sectional view schematically illustrating a portion of the acoustic wave element 11, the under-bump metal layer 13, and the bumps 12 of an acoustic wave device according to modification 2 of example embodiment 1 of the present invention.

Figure 8:
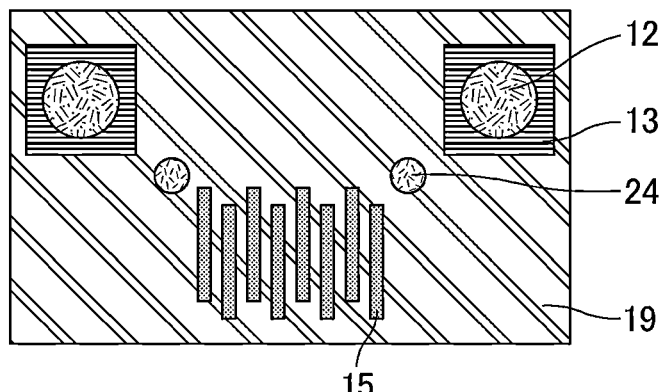
FIG. 8 is a top view schematically illustrating a structure in which the under-bump metal layer 13 and the bumps 12 are connected to the acoustic wave element 11 in the acoustic wave device according to modification 2 of example embodiment 1 of the present invention.

FIG. 8 is a top view schematically illustrating a structure in which the under-bump metal layer 13 and the bumps 12 are connected to the acoustic wave element 11 in the acoustic wave device according to modification 2.

Preferably, the support substrate 16 includes the hollow portion 20 in one main surface thereof, the piezoelectric layer 19 is provided on one main surface of the support substrate 16 to cover the hollow portion 20, and the functional electrodes 15 are provided such that at least a portion thereof overlaps the hollow portion 20 as viewed in a direction in which the support substrate 16 and the piezoelectric layer 19 are laminated together.

The hollow portion 20 may be provided in a portion of the support substrate 16 or may pass through the support substrate 16. The dielectric layer 18 need not necessarily be provided. That is, the hollow portion 13 need only be provided between the support substrate 16 and the piezoelectric layer 19.

For example, the acoustic wave element 11 may be a transversely-excited film bulk acoustic resonator (XBAR) element. In this case, the functional electrode 15 includes an IDT (interdigital transducer) electrode provided on one main surface of the piezoelectric layer 19.

The hole 24 may communicate with the hollow portion 20. For example, when a sacrificial layer to form the hollow portion 20 is formed on the piezoelectric layer 19, an opening hole (a through-hole 28 used in a manufacturing method of the acoustic wave element described later) through which the sacrificial layer is removed may be the hole 24. This can reduce cost and improves layout flexibility.

When the support substrate 16 includes the dielectric layer 18, the hollow portion 20 may pass through or need not pass through the dielectric layer 18.

The hollow portion 20 may pass through the support substrate 16. In this case, the support substrate 16 may include or need not include the dielectric layer 18.

Figure 9:
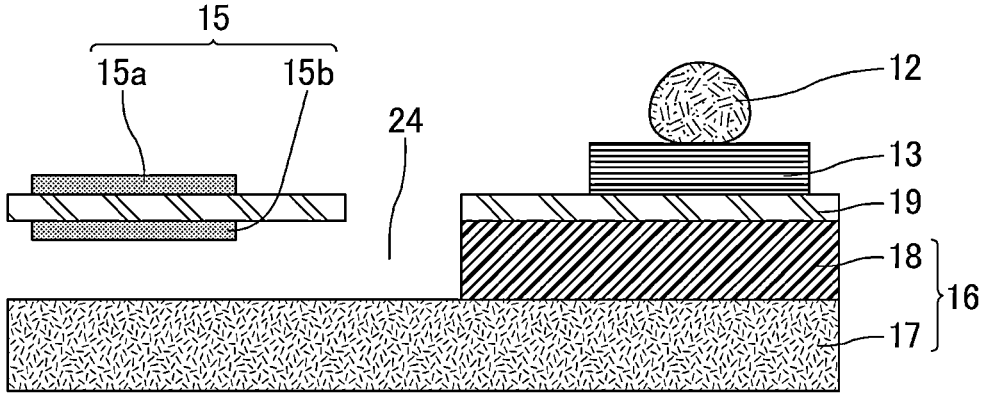
FIG. 9 is a cross-sectional view schematically illustrating a portion of the acoustic wave element 11, the under-bump metal layer 13, and the bumps 12 of an acoustic wave device according to modification 3 of example embodiment 1 of the present invention.

FIG. 9 is a cross-sectional view schematically illustrating a portion of the acoustic wave element 11, the under-bump metal layer 13, and the bumps 12 of an acoustic wave device according to modification 3 of example embodiment 1 of the present invention.

Figure 10:
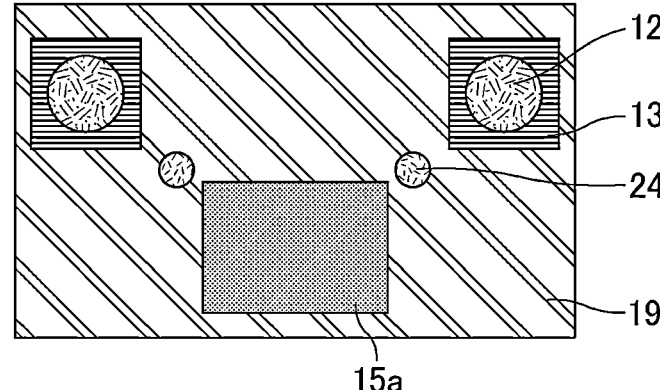
FIG. 10 is a top view schematically illustrating a structure in which the under-bump metal layer 13 and the bumps 12 are connected to the acoustic wave element 11 in the acoustic wave device according to modification 3 of example embodiment 1 of the present invention.

FIG. 10 is a top view schematically illustrating a structure in which the under-bump metal layer 13 and the bumps 12 are connected to the acoustic wave element 11 in the acoustic wave device according to modification 3.

As illustrated in FIGS. 9 and 10, the acoustic wave element 11 may be, for example, a film bulk acoustic resonator (FBAR) element that uses a bulk wave. In this case, the functional electrode 15 includes an upper electrode 15a provided on one main surface of the piezoelectric layer and a lower electrode 15b provided on the other main surface of the piezoelectric layer.

As illustrated in FIGS. 9 and 10, the hole 24 may communicate with the hollow portion 20.

When the support substrate 16 includes the dielectric layer 18, the hollow portion 20 may pass through or need not pass through the dielectric layer 18.

The hollow portion 20 may pass through the support substrate 16. In this case, the support substrate 16 may include or need not include the dielectric layer 18.

An acoustic wave element defining the acoustic wave device according to an example embodiment of the present invention is manufactured by, for example, the following method. An example of a method of manufacturing the acoustic wave element in which the support substrate includes the hollow portion, which is an example of the acoustic wave element, will be described with reference to FIGS. 11 to 17.

Figure 11:
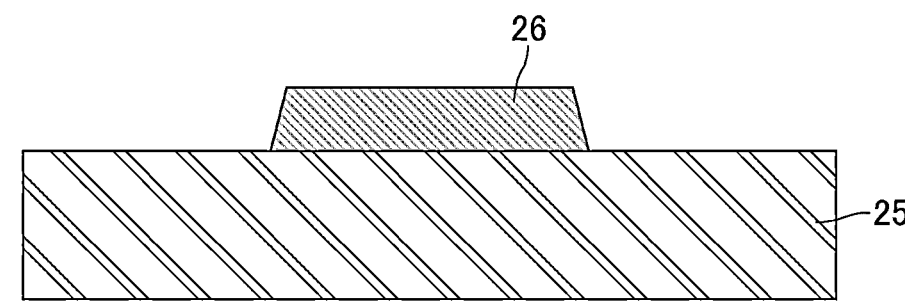
FIG. 11 is a cross-sectional view schematically illustrating an example of a process of forming a sacrificial layer on a piezoelectric substrate according to an example embodiment of the present invention.

FIG. 11 is a cross-sectional view schematically illustrating an example of a process of forming a sacrificial layer on the piezoelectric substrate.

As illustrated in FIG. 11, a sacrificial layer 26 is formed on a piezoelectric substrate 25.

The piezoelectric substrate 25 is, for example, a substrate made of $LiNbO_3$ or $LiTaO_3$.

The material of the sacrificial layer 26 is an appropriate material that can be removed by etching, which will be described later. The material is, for example, ZnO.

The sacrificial layer 26 can be formed by, for example, the following method. First, a ZnO film is formed by, for example, a sputtering method. After that, resist coating, exposure to light, and development are performed in this order. Next, a pattern of the sacrificial layer 26 is formed by wet etching, for example. The sacrificial layer 26 may be formed by another method.

Figure 12:
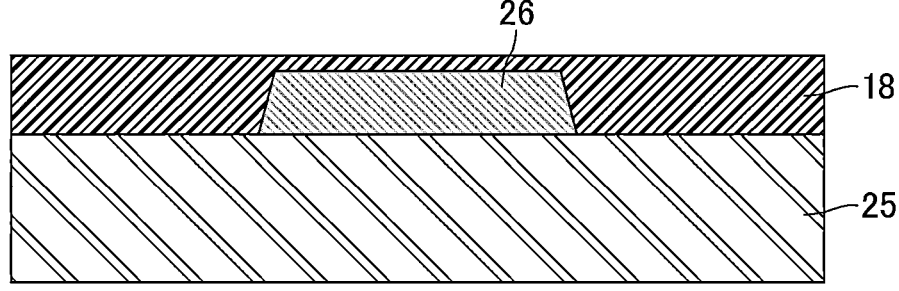
FIG. 12 is a cross-sectional view schematically illustrating an example of a process of forming a dielectric layer.

FIG. 12 is a cross-sectional view schematically illustrating an example of a process of forming a dielectric layer.

As illustrated in FIG. 12, after the dielectric layer 18 is formed to cover the sacrificial layer 26, the surface of the dielectric layer 18 is flattened.

For example, a $SiO_2$ film is formed as the dielectric layer 18. The dielectric layer 18 can be formed by, for example, a sputtering method. The dielectric layer 18 can be flattened by, for example, chemical mechanical polishing (CMP).

Figure 13:
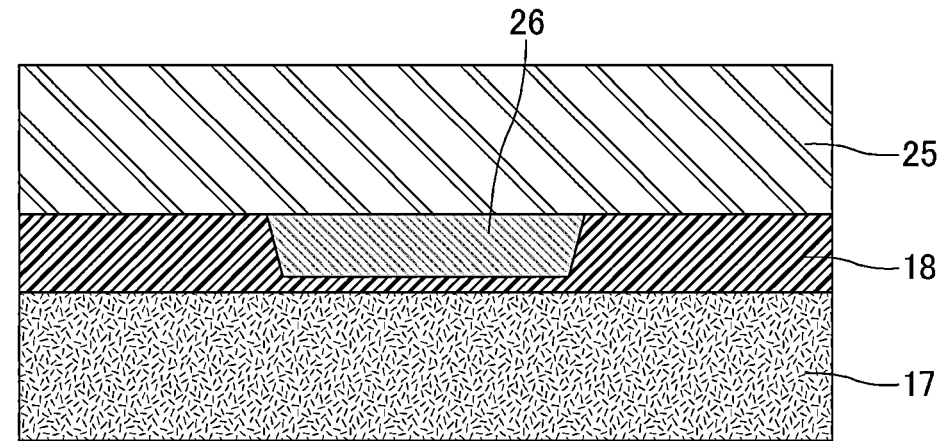
FIG. 13 is a cross-sectional view schematically illustrating an example of a process of joining a support substrate to a dielectric layer.

FIG. 13 is a cross-sectional view schematically illustrating an example of a process of joining the support to the dielectric layer.

As illustrated in FIG. 13, the support 17 is joined to the dielectric layer 18.

Figure 14:
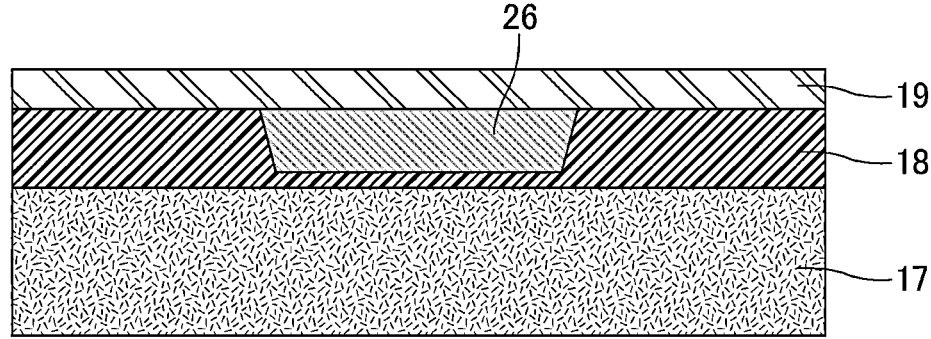
FIG. 14 is a cross-sectional view schematically illustrating an example of a process of thinning a piezoelectric substrate.

FIG. 14 is a cross-sectional view schematically illustrating an example of a process of thinning the piezoelectric substrate.

As illustrated in FIG. 14, the piezoelectric substrate 25 is thinned. As a result, the piezoelectric layer 19 is formed. The piezoelectric substrate 25 can be thinned by, for example, a smart cut method, or polishing.

Figure 15:
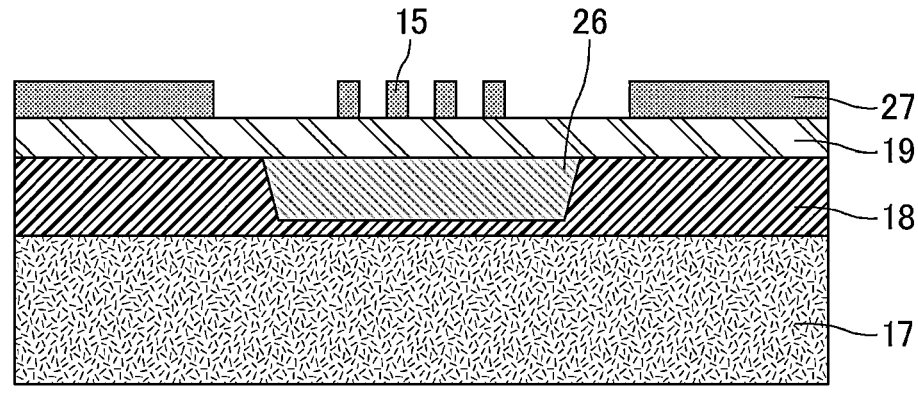
FIG. 15 is a cross-sectional view schematically illustrating an example of a process of forming functional electrodes and a wiring electrode.

FIG. 15 is a cross-sectional view schematically illustrating an example of a process of forming the functional electrodes and the wiring electrode.

As illustrated in FIG. 15, the functional electrodes 15 and a wiring electrode 27 are formed on the first main surface of the piezoelectric layer 19. The functional electrode 15 and the wiring electrode 27 can be formed by, for example, a lift-off method.

Figure 16:
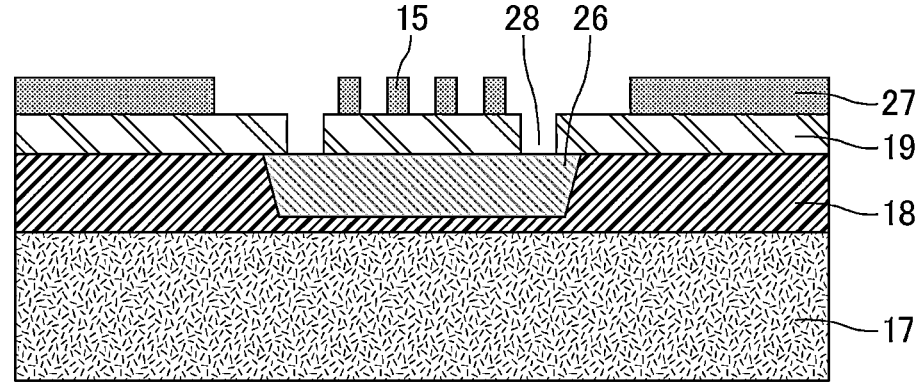
FIG. 16 is a cross-sectional view schematically illustrating an example of a process of forming a through-hole.

FIG. 16 is a cross-sectional view schematically illustrating an example of a process of forming a through-hole.

As illustrated in FIG. 16, the through-holes 28 are formed in the piezoelectric layer 19. The through-holes 28 are formed to extend to the sacrificial layer 22. The through-holes 28 can be formed by, for example, a dry etching method. The through-holes 28 are used as etching holes. In addition, when the through-holes 28 are formed on a straight line connecting the functional electrodes and the bumps to each other, the through-holes 28 can be used as the holes 24.

Figure 17:
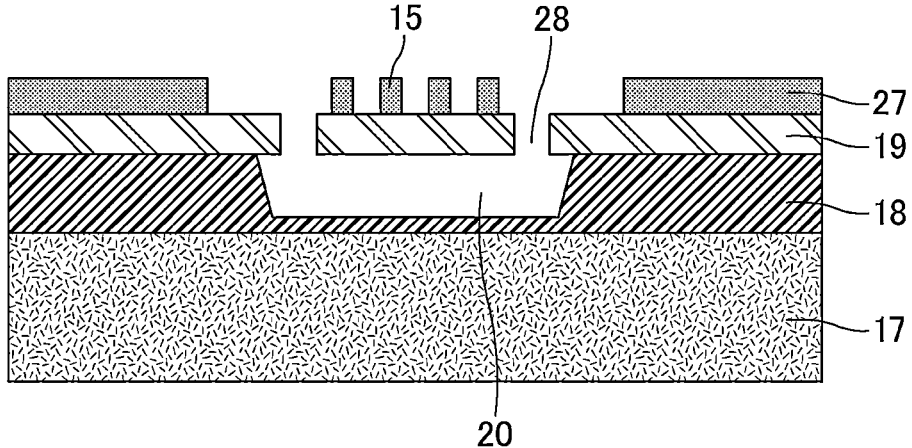
FIG. 17 is a cross-sectional view schematically illustrating an example of a process of removing a sacrificial layer.

FIG. 17 is a cross-sectional view schematically illustrating an example of a process of removing the sacrificial layer.

As illustrated in FIG. 17, the sacrificial layer 26 is removed by using the through-holes 28. When the material of the sacrificial layer 26 is, for example, ZnO, the sacrificial layer 26 can be removed by, for example, wet etching that uses a mixed solution including, for example, acetic acid, phosphoric acid, and water at a ratio of 1:1:10.

The thickness-shear mode and the plate wave will be described in detail below. The following description uses an example in which the functional electrodes are IDT electrodes. The acoustic wave device in the following example corresponds to the acoustic wave element according to an example embodiment of the present invention, and the insulating layer corresponds to the dielectric layer according to an example embodiment of the present invention.

Figure 18:
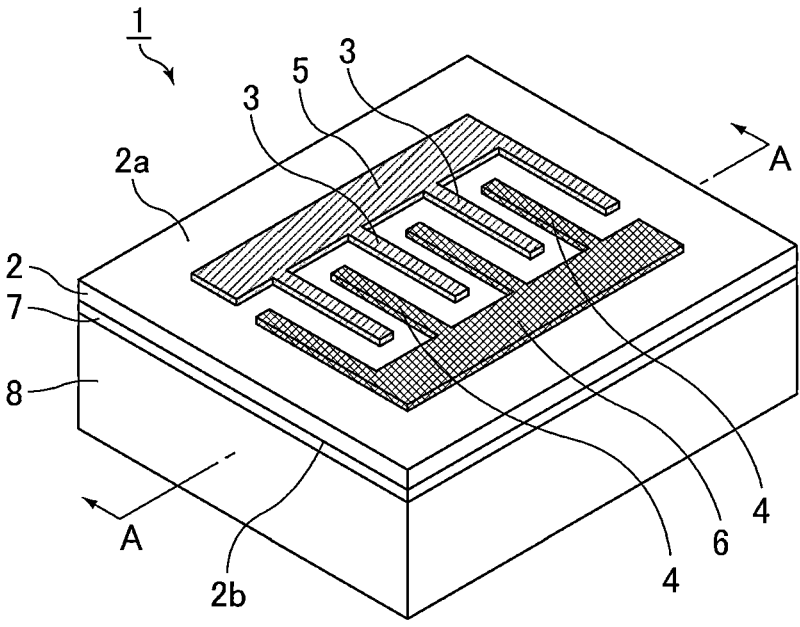
FIG. 18 is a schematic perspective view illustrating an appearance of an example of an acoustic wave device that uses a bulk wave of a thickness-shear mode.
Figure 19:
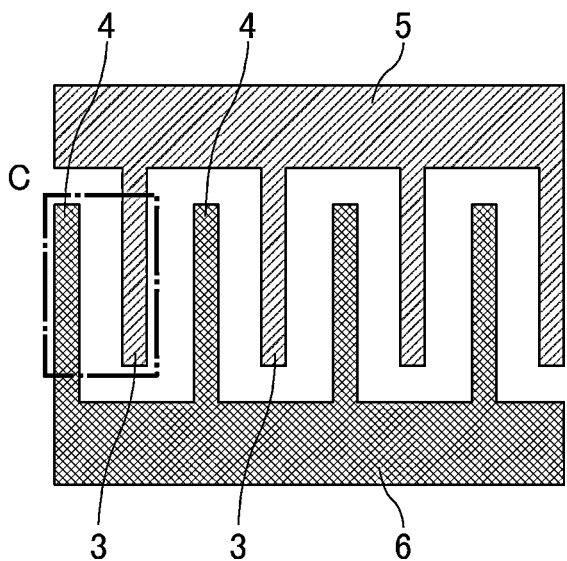
FIG. 19 is a plan view illustrating an electrode structure on a piezoelectric layer of the acoustic wave device illustrated in FIG. 18.
Figure 20:
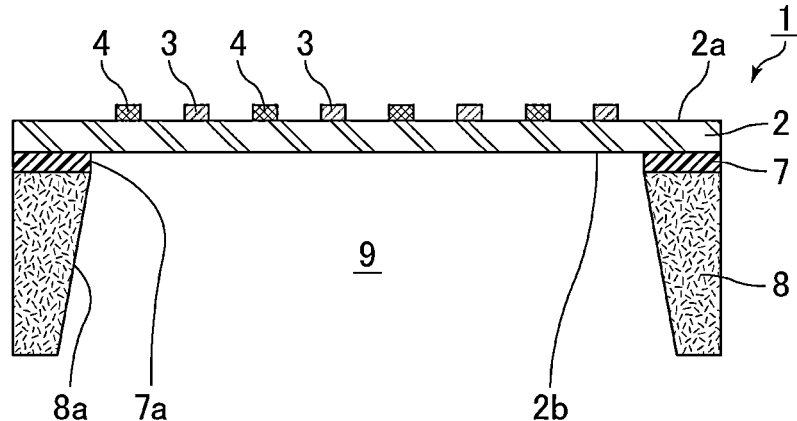
FIG. 20 is a cross-sectional view taken along line A-A in FIG. 18.

FIG. 18 is a schematic perspective view illustrating an appearance of an example of the acoustic wave device that uses a bulk wave of the thickness-shear mode. FIG. 19 is a plan view illustrating an electrode structure on the piezoelectric layer of the acoustic wave device illustrated in FIG. 18. FIG. 20 is a cross-sectional view taken along line A-A in FIG. 18.

The acoustic wave device 1 includes the piezoelectric layer 2 made of, for example, LiNbO₃. The piezoelectric layer 2 may be made of, for example, LiTaO₃. The cut-angle of LiNbO₃ or LiTaO₃ is, for example, a Z-cut but may also be a rotated Y-cut or an X-cut. The propagation orientation is preferably Y propagation and X propagation about ±30°. The thickness of the piezoelectric layer 2 is not particularly limited but is, for example, preferably about 50 nm or greater and about 1000 nm or smaller to effectively excite the thickness-shear mode. The piezoelectric layer 2 includes a first main surface 2a and a second main surface 2b that face away from each other. Electrodes 3 and electrodes 4 are provided on the first main surface 2a of the piezoelectric layer 2. Here, the electrodes 3 are an example of the first electrodes, and the electrodes 4 are an example of the second electrodes. In FIGS. 18 and 19, the plurality of electrodes 3 are a plurality of first electrode fingers connected to a first busbar electrode 5. The plurality of electrodes 4 are a plurality of second electrode fingers connected to a second busbar electrode 6. The plurality of electrodes 3 and the plurality of electrodes 4 are interdigitated with each other. The electrodes 3 and the electrodes 4 are rectangular or substantially rectangular and have a length direction. In the direction orthogonal or substantially orthogonal to the length direction, an electrode 3 and an electrode 4 adjacent thereto face each other. The plurality of electrodes 3, the plurality of electrodes 4, the first busbar electrode 5, and the second busbar electrode 6 define the IDT (interdigital transducer) electrode. The length direction of the electrodes 3 and 4 and the direction orthogonal or substantially orthogonal to the length direction of the electrodes 3 and 4 both intersect the thickness direction of the piezoelectric layer 2. Accordingly, it can be also said that an electrode 3 and an electrode 4 thereto face each other in the direction intersecting the thickness direction of the piezoelectric layer 2. In addition, the length direction of the electrodes 3 and 4 may be replaced with the direction orthogonal or substantially orthogonal to the length direction of the electrodes 3 and 4 illustrated in FIGS. 18 and 19. That is, the electrodes 3 and 4 may extend in the direction in which the first busbar electrode 5 and the second busbar electrode 6 extend in FIGS. 18 and 19. In this case, the first busbar electrode 5 and the second busbar electrode 6 extend in the direction in which the electrodes 3 and 4 extend in FIGS. 18 and 19.

In addition, in a direction orthogonal or substantially orthogonal to the length direction of the electrodes 3 and 4, a plurality of pairs each including an electrode 3 connected to one potential and an adjacent electrode 4 connected to the other potential are provided. Here, the electrode 3 and the electrode 4 are adjacent to each other so as to include a space therebetween without being in direct contact with each other. In addition, when electrode 3 and 4 are adjacent to each other, other electrodes 3 and 4 or electrodes connected to a hot electrode or a ground electrode are not disposed between the electrode 3 and 4. The number of pairs need not be an integer but may be 1.5, 2.5, or the like. The center-to-center distance between electrodes 3 and 4, that is, the pitch, is preferably about 1 μm or greater and about 10 μm or smaller, for example. The center-to-center distance between electrodes 3 and 4 refers to the distance between the middle of the width of the electrode 3 in the direction orthogonal or substantially orthogonal to the length direction of the electrode 3 and the middle of the width of the electrode 4 in the direction orthogonal or substantially orthogonal to the length direction of the electrode 4. In addition, when the number of electrodes 3 or electrodes 4 is two or more (when 1.5 or more pairs each consisting of an electrode 3 and an electrode 4 are present), the center-to-center distance between an electrode 3 and an electrode 4 is the average value of the center-to-center distances between electrodes 3 and 4 adjacent to each other of 1.5 or more pairs of electrodes 3 and 4. In addition, the width of the electrodes 3 and 4, that is, the dimension in the direction in which the electrodes 3 and 4 face each other is, for example, preferably about 150 nm or greater and about 1000 nm or smaller.

When a Z-cut piezoelectric layer is used in the present example embodiment, the direction orthogonal or substantially orthogonal to the length direction of the electrodes 3 and 4 is orthogonal or substantially orthogonal to the polarization direction of the piezoelectric layer 2. This is not applied when a piezoelectric substance of another cut-angle is used as the piezoelectric layer 2. Here, "orthogonal" is not limited to "strictly orthogonal", and may also be "substantially orthogonal" (the angle formed by the polarization direction and the direction orthogonal to the length direction of the electrodes 3 and 4 is, for example, about 90°±10°).

The support 8 is laminated on the second main surface 2b of the piezoelectric layer 2 via the insulating layer 7. The insulating layer 7 and the support 8 have a frame shape and include cavities 7a and 8a as illustrated in FIG. 20. As a result, a hollow portion 9 is formed. The hollow portion 9 is provided so as not to interfere with vibration of an excitation region C (see FIG. 19) of the piezoelectric layer 2. Accordingly, the support 8 is laminated on the second main surface 2b via the insulating layer 7 at a position that does not overlap a portion in which at least one pair of electrodes 3 and 4 is provided. The insulating layer 7 need not be provided. Accordingly, the support 8 can be laminated directly or indirectly on the second main surface 2b of the piezoelectric layer 2.

The insulating layer 7 is made of, for example, silicon oxide. However, for example, an appropriate insulating material, such as silicon oxynitride or alumina, other than silicon oxide can be used. The support 8 is made of, for example, Si. The plane orientation of Si on the piezoelectric layer 2 side may be (100), (110), or (111). The Si preferably has a high resistance of, for example, about 4 kΩ or more. However, the support 8 can also be made of an appropriate insulating material or semiconductor material. The material of the support 8 may be, for example, a piezoelectric substance, such as aluminum oxide, lithium tantalate, lithium niobate, or quartz, ceramic, such as alumina, magnesia, sapphire, silicon nitride, aluminum nitride, silicon carbide, zirconia, cordierite, mullite, or forsterite, steatite, a dielectric, such as diamond or glass, a semiconductor, such as gallium nitride.

The plurality of electrodes 3, the plurality of electrodes 4, the first busbar electrode 5, and the second busbar electrode 6 are made of an appropriate metal, such as Al, or an appropriate alloy, such as AlCu alloy, for example. In the present example embodiment, for example, the electrodes 3, the electrodes 4, the first busbar electrode 5, and the second busbar electrode 6 have a structure in which an Al film is laminated on a Ti film. An adhesive layer other than a Ti film may be used.

An AC voltage is applied between the plurality of electrodes 3 and the plurality of electrodes 4 for driving. More specifically, an AC voltage is applied between the first busbar electrode 5 and the second busbar electrode 6. As a result, it is possible to obtain resonance characteristics using a bulk wave of the thickness-shear mode that is excited in the piezoelectric layer 2. In addition, in the acoustic wave device 1, for example, d/p about 0.5 or smaller where d is the thickness of the piezoelectric layer 2 and p is the center-to-center distance of any one pair of adjacent electrodes 3 and 4 of the plurality of pairs of electrodes 3 and 4. Accordingly, a bulk wave of the thickness-shear mode is effectively excited, and good resonance characteristics can be obtained. More preferably, for example, d/p is about 0.24 or smaller and, in this case, an even better resonance characteristics can be obtained. When the number of electrodes 3 or electrodes 4 is two or more, that is, when 1.5 or more pairs each including an electrode 3 and an electrode 4 are present, the center-to-center distance p between an electrode 3 and an electrode 4 is the average distance of the center-to-center distances between electrodes 3 and 4 adjacent to each other.

Since the acoustic wave device 1 according to the present example embodiment has the structure described above, even when the number of pairs of electrodes 3 and 4 is reduced for downsizing, the Q value is unlikely to decrease.

This is because the resonator requires no reflectors on both sides and has less propagation loss. In addition, the reason why no reflectors are required is because a bulk wave of the thickness-shear mode is used. The difference between a Lamb wave used by a conventional acoustic wave device and a bulk wave of the thickness-shear mode will be described with reference to FIGS. 21 and 22.

Figure 21:
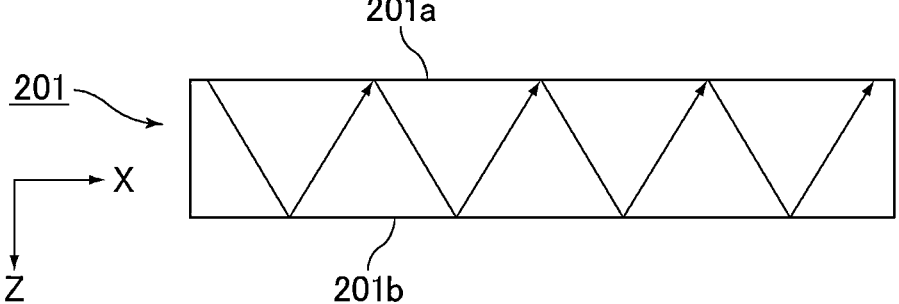
FIG. 21 is a schematic elevational cross-sectional view for describing a Lamb wave that propagates through a piezoelectric film of an acoustic wave device.

FIG. 21 is a schematic elevational cross-sectional view for describing a Lamb wave that propagates through a piezoelectric film of an acoustic wave device. As illustrated in FIG. 21, in the acoustic wave device as described in Japanese Unexamined Patent Application Publication No. 2012-257019, a wave propagates through the piezoelectric film 201 as indicated by arrows. Here, in the piezoelectric film 201, a Z direction is the direction in which a first main surface 201a and a second main surface 201b face away from each other and is parallel or substantially parallel to the thickness direction in which the first main surface 201a and the second main surface 201b are connected. An X direction is the direction in which the electrode fingers of the IDT electrode are arranged. As illustrated in FIG. 21, a Lamb wave propagates in the X direction. Although the entire piezoelectric film 201 vibrates because the Lamb wave is a plate wave, the wave propagates in the X direction, and accordingly, reflectors are disposed on both sides to obtain resonance characteristics. Accordingly, a wave propagation loss occurs and, when downsizing is attempted, that is, when the number of pairs of electrode fingers is reduced, the Q value decreases.

Figure 22:
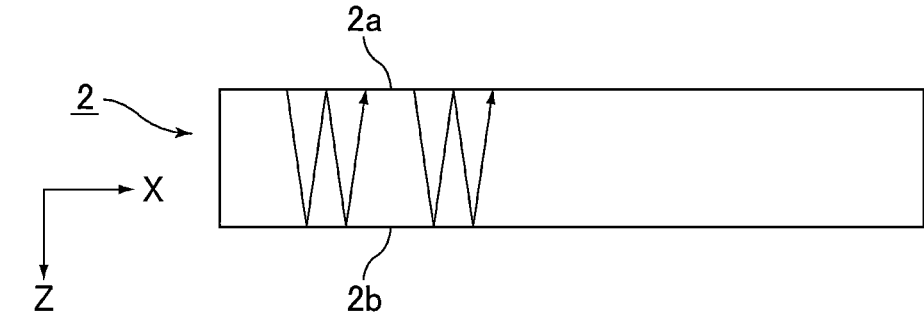
FIG. 22 is a schematic elevational cross-sectional view for describing a bulk wave of a thickness-shear mode that propagates through a piezoelectric layer of an acoustic wave device.

On the other hand, FIG. 22 is a schematic elevational cross-sectional view for describing a bulk wave of the thickness-shear mode that propagates through a piezoelectric layer of an acoustic wave device. As illustrated in FIG. 22, in the acoustic wave device 1 according to the present example embodiment, since vibration displacement occurs in a thickness-shear direction, the wave propagates substantially in a direction in which the first main surface 2a and second main surface 2b of the piezoelectric layer 2 are connected, that is, in the Z direction, and resonates. That is, the X-direction component of the wave is significantly smaller than the Z-direction component thereof. Since resonance characteristics are obtained by the propagation of the wave in the Z direction, no reflectors are needed. Accordingly, no propagation loss occurs during propagation to reflectors. Accordingly, even when the number of pairs of electrodes 3 and 4 is reduced to achieve downsizing, the Q value is unlikely to decrease.

Figure 23:
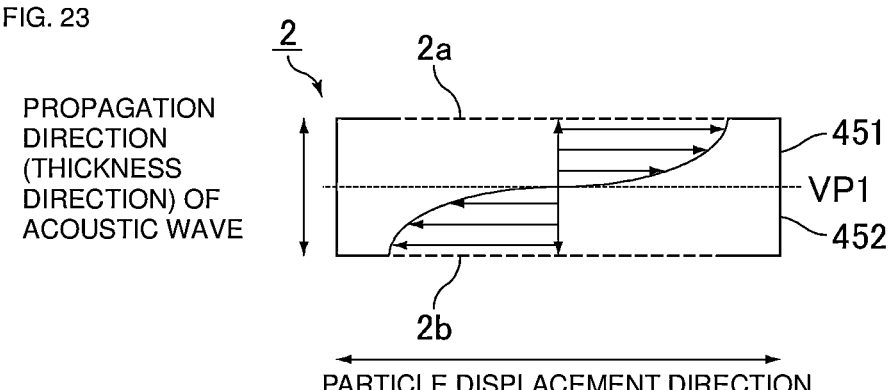
FIG. 23 is a diagram illustrating an amplitude direction of a bulk wave of a thickness-shear mode.

FIG. 23 is a diagram illustrating the amplitude direction of a bulk wave of the thickness-shear mode. As illustrated in FIG. 23, the amplitude direction of a bulk wave of the thickness-shear mode is reversed between a first region 451 included in the excitation region C of the piezoelectric layer 2 and a second region 452 included in the excitation region C. A bulk wave excited when a voltage is applied between the electrodes 3 and the electrodes 4 such that the electrodes 4 have a higher potential than the electrodes 3 is schematically illustrated in FIG. 23. The first region 451 is located between the first main surface 2a and a virtual plane VP1 that is orthogonal or substantially orthogonal to the thickness direction of the piezoelectric layer 2 and bisects the piezoelectric layer 2 in the excitation region C. The second region 452 is located between the virtual plane VP1 and the second main surface 2b in the excitation region C.

As described above, at least one pair of electrodes 3 and 4 is provided in the acoustic wave device 1, but the number of pairs of electrodes 3 and 4 need not be two or more because the wave does not propagate in the X direction.

That is, at least one pair of electrodes need only be provided.

For example, the electrodes 3 are connected to the hot potential, and the electrodes 4 are connected to the ground potential. However, the electrodes 3 may be connected to the ground potential, and the electrodes 4 may be connected to the hot potential. In the present example embodiment, at least one pair of electrodes is connected to the hot potential or the ground potential as described above, and no floating electrode is provided.

Figure 24:
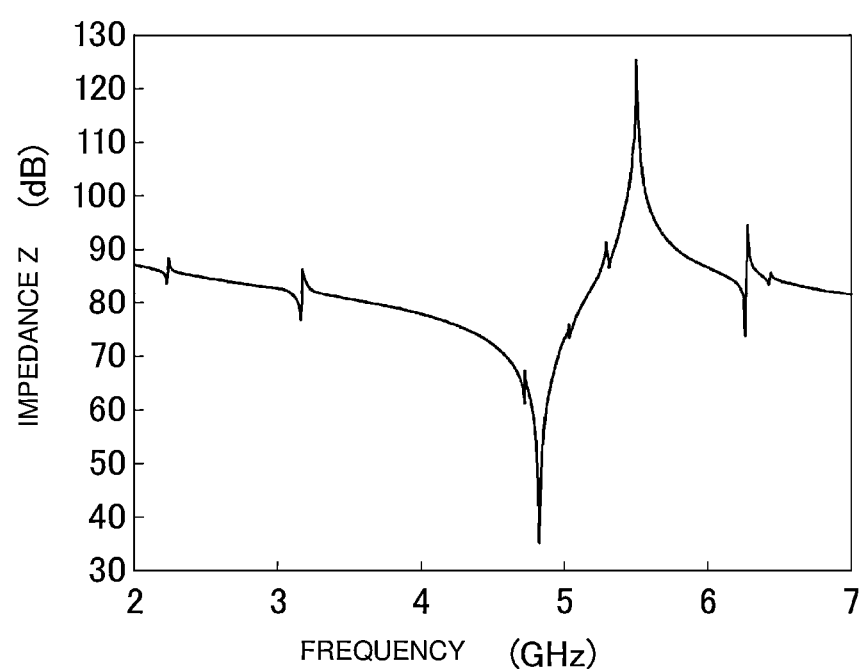
FIG. 24 is a diagram illustrating an example of resonance characteristics of the acoustic wave device illustrated in FIG. 18.

FIG. 24 is a diagram illustrating an example of resonance characteristics of the acoustic wave device illustrated in FIG. 18. The design parameters of the acoustic wave device 1 having the resonance characteristics are described below.

Piezoelectric layer 2: LiNbO$_3$ with Euler angles (0°, 0°, 90°), thickness=about 400 nm The length of the region in which electrodes 3 and 4 overlap each other in a direction orthogonal to the length direction of the electrodes 3 and 4, that is, the length of the excitation region C is about 40 µm, the number of pairs of electrodes 3 and 4 is 21, the center-to-center distance is about 3 µm, the width of the electrodes 3 and 4 is about 500 nm, and d/p is about 0.133.

Insulating layer 7: 1 µm-thick silicon oxide film

Support 8: Si substrate.

The length of the excitation region C is the dimension of the excitation region C in a direction parallel or substantially parallel to the length direction of the electrodes 3 and 4.

In the acoustic wave device 1, the inter-electrode distance of a pair of electrodes 3 and 4 is the same or substantially the same among the plurality of pairs. That is, the electrodes 3 and the electrodes 4 are disposed at equal or substantially equal intervals.

As is clear from FIG. 24, although no reflectors are provided, good resonance characteristics with a fractional bandwidth of about 12.5% are obtained.

When d is the thickness of the piezoelectric layer 2 and p is the center-to-center distance between electrodes 3 and 4, d/p is, for example, preferably about 0.5 or smaller, and more preferably about 0.24 or smaller in the present example embodiment, as described above. The reason will be described with reference to FIG. 25.

Figure 25:
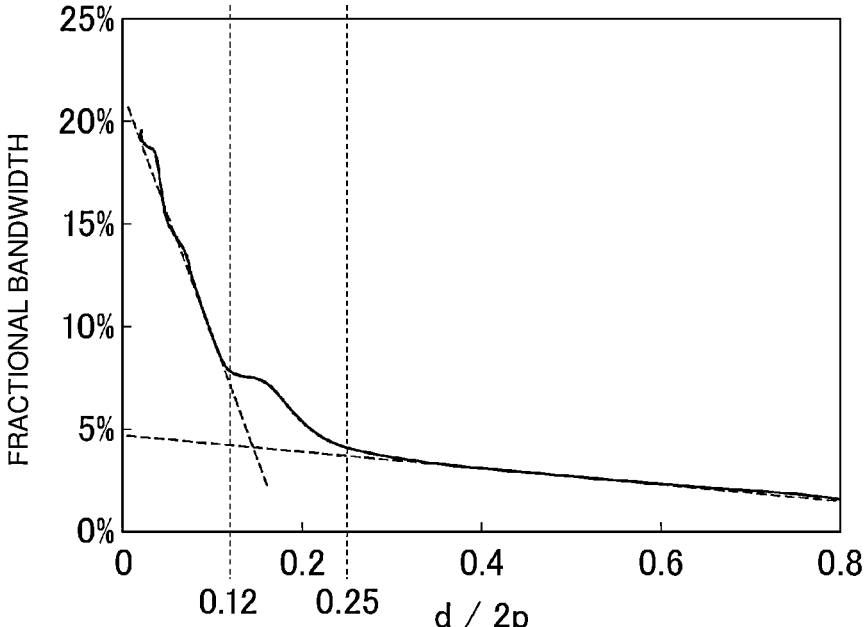
FIG. 25 is a diagram illustrating the relationship between d/2p and a fractional bandwidth that is a resonator of an acoustic wave device where p is the center-to-center distance of adjacent electrodes and d is the thickness of the piezoelectric layer.

As in the acoustic wave device having the resonance characteristics illustrated in FIG. 24, a plurality of acoustic wave devices have been obtained by changing d/2p. FIG. 25 is a diagram illustrating the relationship between d/2p and the fractional bandwidth that is a resonator of the acoustic wave device where p is the center-to-center distance of adjacent electrodes and d is the thickness of the piezoelectric layer.

As is clear from FIG. 25, when d/2p exceeds about 0.25, that is, when d/p>about 0.5, the fractional bandwidth is less than about 5% even if d/p is adjusted. On the other hand, when d/2p≤about 0.25, that is, when d/p≤about 0.5, the fractional bandwidth can be about 5% or greater by changing d/p is within this range, that is, a resonator with a high coupling factor can be obtained. In addition, when d/2p is about 0.12 or smaller, that is, when d/p is about 0.24 or smaller, the fractional bandwidth can be increased to about 7% or greater. In addition, by adjusting d/p within this range, a resonator having an even wider fractional bandwidth can be obtained, and a resonator having an even higher coupling coefficient can be achieved. Accordingly, a resonator having a high coupling coefficient that uses a bulk wave of the thickness-shear mode can be obtained by setting d/p to about 0.5 or smaller.

As described above, at least one pair of electrodes may be one pair, and in the case of one pair of electrodes, p is the center-to-center distance of adjacent electrodes 3 and 4. In addition, the number of pairs of electrodes is 1.5 or greater, p may be the average distance of the center-to-center distances between adjacent electrodes 3 and 4.

In addition, when there are variations in thickness d of the piezoelectric layer 2, an average value of the thicknesses may be used.

Figure 26:
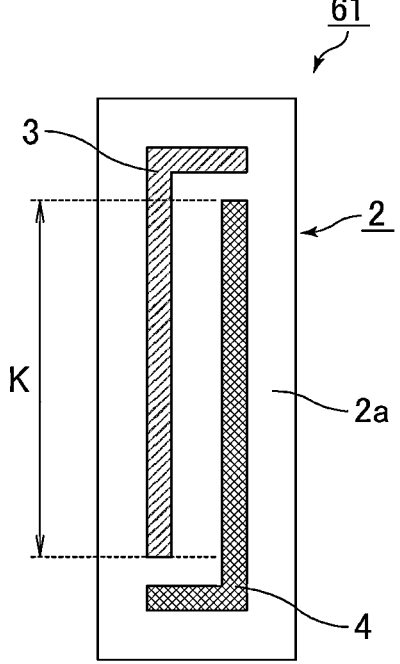
FIG. 26 is a plan view illustrating another example of an acoustic wave device that uses a bulk wave of the thickness-shear mode.

FIG. 26 is a plan view illustrating another example of an acoustic wave device that uses a bulk wave of the thickness-shear mode.

In the acoustic wave device 61, a pair of electrodes 3 and 4 is provided on the first main surface 2a of the piezoelectric layer 2. K in FIG. 26 is an intersecting width. As described above, in the acoustic wave device according to the present example embodiment, the number of pairs of electrodes may be one. Even in this case, when the d/p is 0.5 or smaller, a bulk wave of the thickness-shear mode can be effectively excited.

In the acoustic wave device according to the present example embodiment, for example, MR≤about 1.75 (d/p)+0.075 is preferably met where MR is a metallization ratio that is the ratio of the area of adjacent electrodes 3 and 4 of the plurality of electrodes 3 and 4 to the area of the excitation region in which the adjacent electrodes 3 and 4 overlap each other as viewed in a direction in which the adjacent electrodes 3 and 4 face each other. In this case, a spurious response can be effectively reduced. This will be described with reference to FIGS. 27 and 28.

Figure 27:
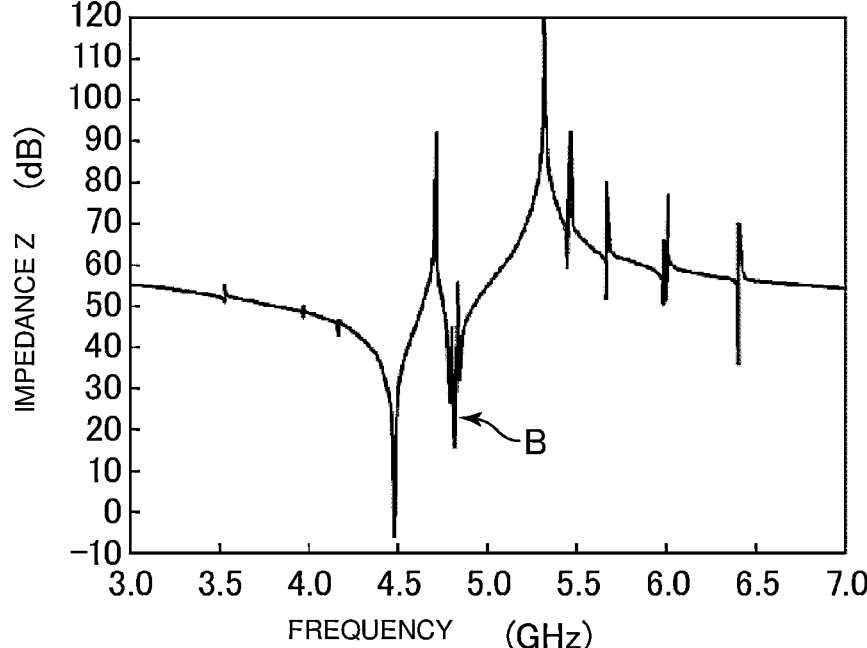
FIG. 27 is a reference diagram illustrating an example of resonance characteristics of the acoustic wave device illustrated in FIG. 18.

FIG. 27 is a reference diagram illustrating an example of resonance characteristics of the acoustic wave device illustrated in FIG. 18. The spurious response indicated by arrow B appears between the resonant frequency and the anti-resonant frequency. It is assumed that d/p=about 0.08 and the Euler angles LiNbO$_3$ are (0°, 0°, 90°). It is also assumed that the metallization ratio MR=about 0.35.

The metallization ratio MR will be described with reference to FIG. 19. A focus is placed on a pair of electrodes 3 and 4 in the electrode structure in FIG. 19 and it is assumed that only this pair of electrodes 3 and 4 is provided. In this case, the portion surrounded by a dashed line C is the excitation region. In the excitation region, when the electrodes 3 and 4 are viewed in a direction orthogonal or substantially orthogonal to the length direction of the electrodes 3 and 4, that is, in a direction in which the electrodes 3 and 4 face each other, the electrode 3 overlaps the electrode 4, the electrode 4 overlaps the electrode 3, and the region between the electrode 3 and the electrode 4 overlaps the electrode 3 and the electrode. The ratio of the area of the electrodes 3 and 4 in the excitation region C to the area of the excitation region is the metallization ratio MR. That is, the metallization ratio MR is the ratio of the area of the metallized portion to the area of the excitation region.

When a plurality of pairs of electrodes are provided, MR may be the ratio of the metallized portions included in all excitation regions to the sum of the areas of the excitation regions.

Figure 28:
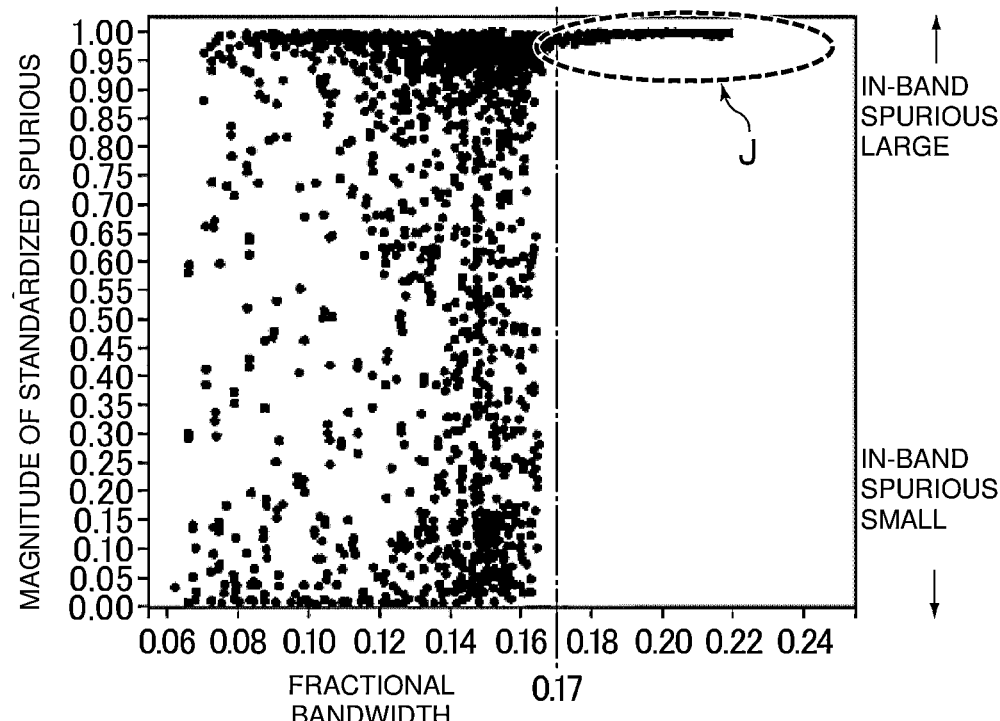
FIG. 28 is a diagram illustrating the relationship between the phase rotation amount of impedance of spurious standardized at about 180° as the magnitude of a spurious response and the fractional bandwidth when many elastic wave resonators are configured according to an example embodiment of the present invention.

FIG. 28 is a diagram illustrating the relationship between the phase rotation amount of impedance of a spurious response standardized at about 180° as the magnitude of the spurious response and the fractional bandwidth when many elastic wave resonators are configured according to the present example embodiment. The fractional bandwidth has been adjusted by variously changing the film thickness of the piezoelectric layer and the dimensions of the electrodes. FIG. 28 illustrates the results when the piezoelectric layer made of Z-cut LiNbO$_3$ is used, but a similar tendency can be seen even when the piezoelectric layer with another cut-angle is used.

In the region in ellipse J in FIG. 28, a large spurious response of about 1.0 is observed. As is clear from FIG. 28, when the fractional bandwidth exceeds about 0.17, that is, about 17%, even if the parameters that define the fractional bandwidth are changed, a large spurious response with a spurious level of about 1 or higher appears within the passband. That is, a large spurious response indicated by arrow B appears within the passband as in the resonance characteristics illustrated in FIG. 27. Accordingly, the fractional bandwidth is, for example, preferably about 17% or smaller.

In this case, the spurious response can be reduced by adjusting the film thickness of the piezoelectric layer 2 and the dimensions of the electrodes 3 and 4.

Figure 29:
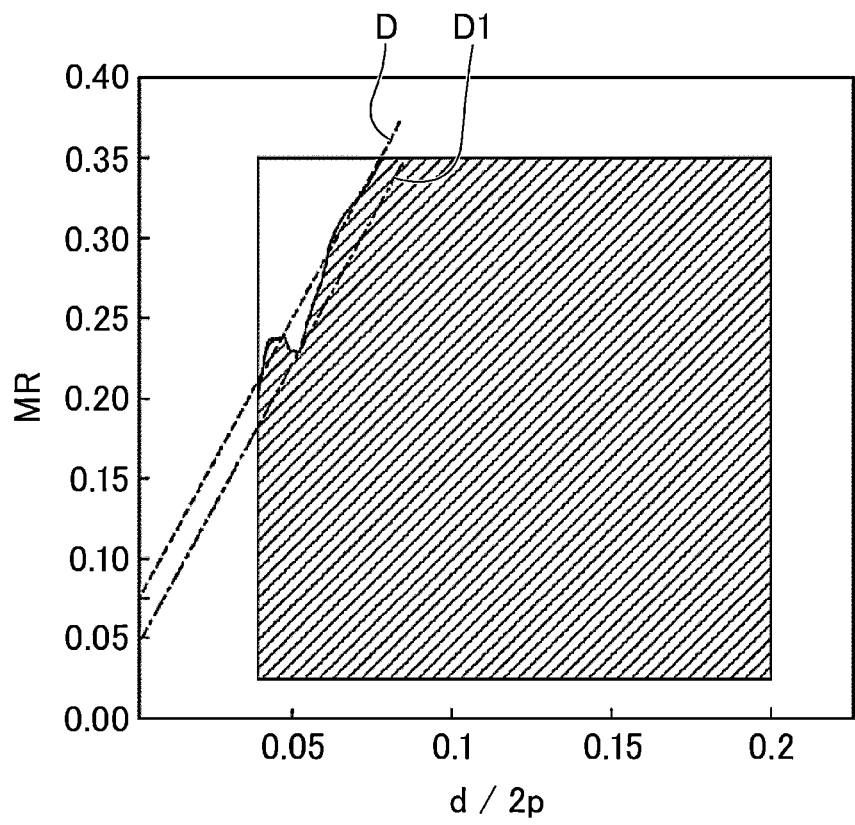
FIG. 29 is a diagram illustrating the relationship between d/2p, a metallization ratio MR, and the fractional bandwidth.

FIG. 29 is a diagram illustrating the relationship between d/2p, the metallization ratio MR, and the fractional bandwidth. Various acoustic wave devices are configured by changing d/2p and MR of the acoustic wave device described above, and the fractional bandwidths thereof have been measured.

The hatched portion on the right side of a dashed line D in FIG. 29 is the region in which the fractional bandwidth is about 17% or smaller. The boundary between the hatched region and the unhatched region is expressed as MR=about 3.5 (d/2p)+0.075. That is, MR=about 1.75 (d/p)+0.075. Accordingly, for example, MR≤about 1.75 (d/p)+0.075 is preferably met. In this case, the fractional bandwidth is readily set to about 17% or smaller. The region on the right side of MR=about 3.5 (d/2p)+0.05 represented by a dash-dot line D1 in FIG. 29 is more preferable. That is, when MR≤about 1.75 (d/p)+0.05 is met, the fractional bandwidth can be about 17% or smaller with greater certainty.

Figure 30:
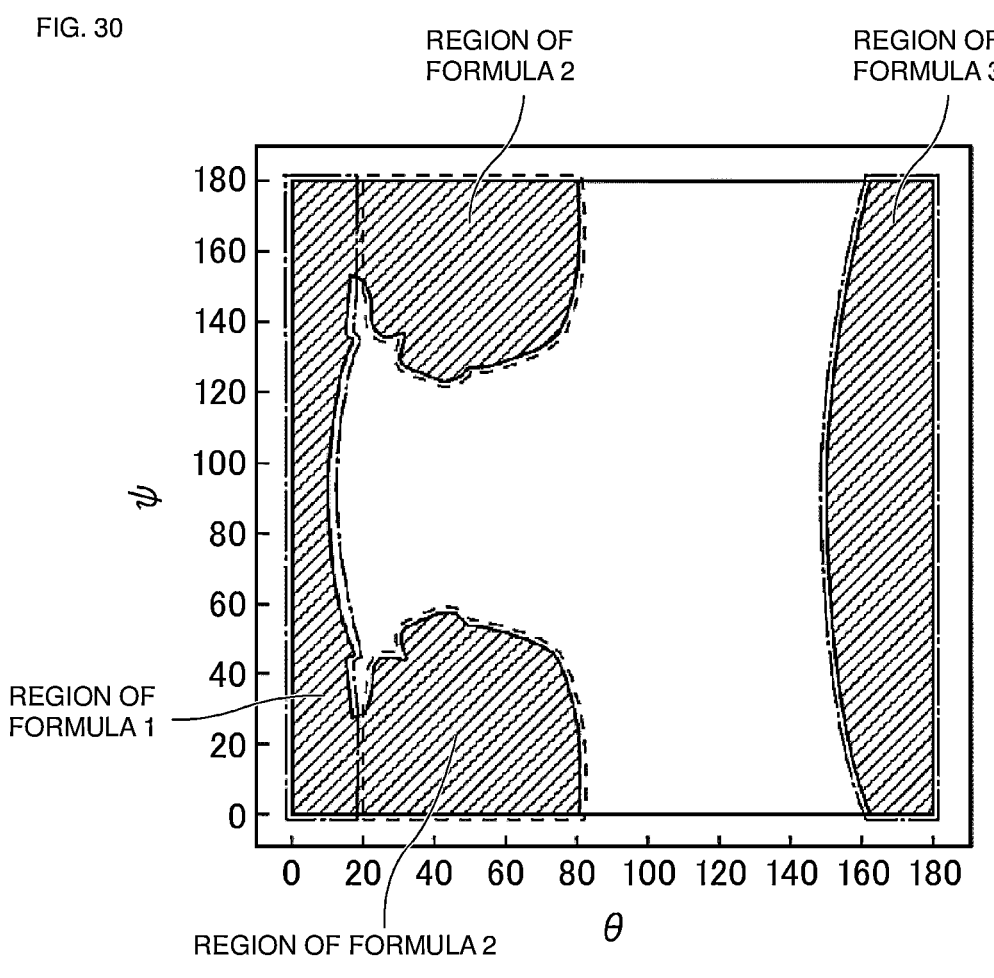
FIG. 30 is a diagram illustrating a map of the fractional bandwidth with respect to the Euler angles (0°, θ, ψ) of LiNbO$_3$ when d/p is brought as close to 0 as possible.

FIG. 30 is a diagram illustrating a map of the fractional bandwidth with respect to the Euler angles (0°, θ, ψ) of LiNbO$_3$ when d/p is brought as close to 0 as possible.

The hatched portions in FIG. 30 are regions in which a fractional bandwidth of at least 5% or greater can be obtained, and the ranges of the regions can be approximated as the ranges represented by the following formulas 1, 2, and 3.

$$(0° ± 10°, 0° \text{ to } 20°, \text{arbitrary } \psi) \qquad \text{Formula 1}$$

$$(0° ± 10°, 20° \text{ to } 80°, 0° \text{ to } 60°(1 - (\theta - 50)2/900)1/2) \text{ or} \qquad \text{Formula 2}$$

$$(0° ± 10°, 20° \text{ to } 80°, [180° - 60°(1 - (\theta - 50)2/900)1/2] \text{ to } 180°)$$

$$(0° ± 10°, [180° - 30°(1 - (\psi - 90)2/8100)1/2] \text{ to } 180°, \qquad \text{Formula 3}$$

$$\text{arbitrary } \psi)$$

Accordingly, the range of the Euler angles in formula 1, formula 2, or formula 3 is preferable because the fractional bandwidth can be sufficiently wide.

Figure 31:
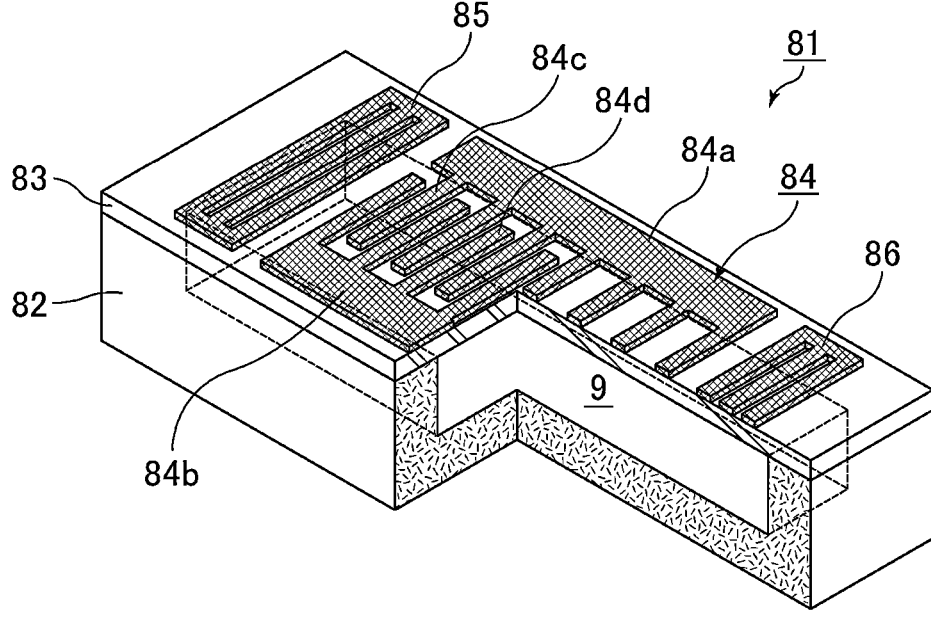
FIG. 31 is a partially cutaway perspective view for describing an example of an acoustic wave device that uses a Lamb wave.

FIG. 31 is a partially cutaway perspective view for describing an example of an acoustic wave device that uses a Lamb wave.

An acoustic wave device 81 includes a support substrate 82. The support substrate 82 includes a recessed portion that is open toward the top surface thereof. The piezoelectric layer 83 is laminated on the support substrate 82. This defines the hollow portion 9. An IDT electrode 84 is provided on the piezoelectric layer 83 above the hollow portion 9. Reflectors 85 and 86 are provided on both sides of the IDT electrode 84 in the direction in which an acoustic wave propagates. In FIG. 31, the outer edges of the hollow portion 9 are indicated by dotted lines. The IDT electrode 84 includes a first busbar electrode 84a, a second busbar electrode 84b, electrodes 84c as the plurality of first electrode fingers, and electrodes 84d as the plurality of second electrode fingers. The plurality of electrodes 84c are connected to the first busbar electrode 84a. The plurality of electrodes 84d are connected to the second busbar electrode 84b. The plurality of electrodes 84c and the plurality of electrodes 84d are interdigitated with each other.

In the acoustic wave device 81, a Lamb wave as a plate wave is excited by applying an AC electric field to the IDT electrode 84 above the hollow portion 9. Since the reflectors 85 and 86 are provided on both sides, resonance characteristics of the Lamb wave can be obtained.

As described above, acoustic wave devices according to example embodiments of the present invention may use a plate wave, such as a Lamb wave.

Alternatively, an acoustic wave device according to an example embodiment of the present invention may use a bulk wave.

That is, acoustic wave devices according to example embodiments of the present invention can also be applied to bulk acoustic wave (BAW) elements. In this case, the functional electrodes are the upper electrode and the lower electrode.

Figure 32:
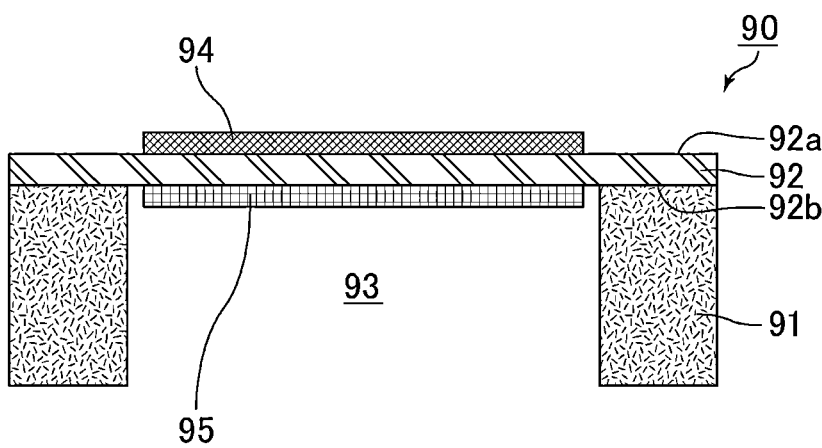
FIG. 32 is a cross-sectional view schematically illustrating an example of an acoustic wave device that uses a bulk wave.

FIG. 32 is a cross-sectional view schematically illustrating an example of an acoustic wave device that uses a bulk wave.

An acoustic wave device 90 includes a support substrate 91. The hollow portion 93 passes through the support substrate 91. A piezoelectric layer 92 is laminated on the support substrate 91. An upper electrode 94 is provided on a first main surface 92a of the piezoelectric layer 92, and a lower electrode 95 is provided on a second main surface 92b of the piezoelectric layer 92.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
an acoustic wave element;
a plurality of bumps electrically connected to the acoustic wave element;
an under-bump metal layer between the acoustic wave element and the plurality of bumps;
a wiring substrate on which the acoustic wave element is mounted; and
an encapsulating body covering the acoustic wave element on the wiring substrate; wherein
the acoustic wave element includes a support substrate, a piezoelectric layer on one main surface of the support substrate, and a functional electrode on at least one main surface of the piezoelectric layer;
the wiring substrate is electrically connected to the acoustic wave element via the under-bump metal layer and the plurality of bumps;

the piezoelectric layer includes a hole passing through the piezoelectric layer on at least a portion of a straight line connecting the functional electrode and the bumps to each other;

the piezoelectric layer is made of a monocrystalline piezoelectric substance; and a straight line connecting the functional electrode and one of the plurality of bumps to each other is parallel or substantially parallel to a crystal cleavage direction of the piezoelectric layer.

2. The acoustic wave device according to claim 1, wherein the hole is provided on a straight line connecting the functional electrode and one of the plurality of bumps that is closest to the functional electrode to each other.

3. The acoustic wave device according to claim 1, wherein the support substrate includes a dielectric layer on the one main surface thereof.

4. An acoustic wave device comprising:

an acoustic wave element;

a plurality of bumps electrically connected to the acoustic wave element;

an under-bump metal layer between the acoustic wave element and the plurality of bumps;

a wiring substrate on which the acoustic wave element is mounted; and an encapsulating body covering the acoustic wave element on the wiring substrate; wherein the acoustic wave element includes a support substrate, a piezoelectric layer on one main surface of the support substrate, and a functional electrode on at least one main surface of the piezoelectric layer;

the wiring substrate is electrically connected to the acoustic wave element via the under-bump metal layer and the plurality of bumps;

the piezoelectric layer includes a hole passing through the piezoelectric layer on at least a portion of a straight line connecting the functional electrode and the bumps to each other;

the support substrate includes a dielectric layer on the one main surface thereof; and the hole extends to the dielectric layer.

5. The acoustic wave device according to claim 4, wherein the piezoelectric layer is made of a monocrystalline piezoelectric substance.

6. The acoustic wave device according to claim 4, wherein the hole is provided on a straight line connecting the functional electrode and one of the plurality of bumps that is closest to the functional electrode to each other.

7. An acoustic wave device comprising:

an acoustic wave element;

a plurality of bumps electrically connected to the acoustic wave element;

an under-bump metal layer between the acoustic wave element and the plurality of bumps;

a wiring substrate on which the acoustic wave element is mounted; and an encapsulating body covering the acoustic wave element on the wiring substrate; wherein the acoustic wave element includes a support substrate, a piezoelectric layer on one main surface of the support substrate, and a functional electrode on at least one main surface of the piezoelectric layer;

the wiring substrate is electrically connected to the acoustic wave element via the under-bump metal layer and the plurality of bumps;

the piezoelectric layer includes a hole passing through the piezoelectric layer on at least a portion of a straight line connecting the functional electrode and the bumps to each other;

the support substrate includes a hollow portion in the one main surface thereof;

the piezoelectric layer is provided on the one main surface of the support substrate to cover the hollow portion;

the functional electrode is provided such that a portion thereof overlaps the hollow portion in a direction in which the support substrate and the piezoelectric layer are laminated together; and the hole communicates with the hollow portion.

8. The acoustic wave device according to claim 7, wherein the functional electrode includes one or more first electrodes, a first busbar electrode to which the one or more first electrodes are connected, one or more second electrodes, and a second busbar electrode to which the one or more second electrodes are connected.

9. The acoustic wave device according to claim 8, wherein, when a center-to-center distance between a first electrode and a second electrode that are adjacent to each other of the one or more first electrodes and the one or more second electrodes is p, a thickness of the piezoelectric layer is about 2p or smaller.

10. The acoustic wave device according to claim 8, wherein d/p≤about 0.5 is satisfied, where d is a thickness of the piezoelectric layer, and p is a center-to-center distance between a first electrode and a second electrode that are adjacent to each other of the one or more first electrodes and the one or more second electrodes.

11. The acoustic wave device according to claim 10, wherein d/p≤about 0.24 is satisfied.

12. The acoustic wave device according to claim 8, wherein MR≤about 1.75(d/p)+0.075 is satisfied, where MR is a metallization ratio, d is a thickness of the piezoelectric layer, and p is a center-to-center distance between a first electrode and a second electrode that are adjacent to each other of the one or more first electrodes and the one or more second electrodes, the metallization ratio being a ratio of an area of the first electrode and the second electrode that are adjacent to each other to an area of an excitation region in which the first electrode and the second electrode that are adjacent to each other overlap each other as viewed in a direction in which the first electrode and the second electrode that are adjacent to each other face each other.

13. The acoustic wave device according to claim 12, wherein MR≤about 1.75(d/p)+0.05 is satisfied.

14. The acoustic wave device according to claim 7, wherein the piezoelectric layer is made of lithium niobate or lithium tantalate.

15. The acoustic wave device according to claim 14, wherein the acoustic wave device is structured to generate a bulk wave of a thickness-shear mode.

16. The acoustic wave device according to claim 14, wherein

Euler angles ($\phi$, $\theta$, $\psi$) of the lithium niobate or the lithium tantalate are within a range of formula 1, formula 2, or formula 3:

$$(0° \pm 10°, 0° \text{ to } 20°, \text{arbitrary } \psi); \qquad \text{Formula 1}$$

$$(0° \pm 10°, 20° \text{ to } 80°, 0° \text{ to } 60°(1 - (\theta - 50)2/900)1/2) \text{ or} \qquad \text{Formula 2}$$

$$(0° \pm 10°, 20° \text{ to } 80°, [180° - 60°(1 - (\theta - 50)2/900)1/2] \text{ to } 180°); \text{ and}$$

-continued $$\left(0° \pm 10°, \left[180° - 30°(1 - (\psi - 90)2/8100)1/2\right] \text{ to } 180°, \right. \qquad \text{Formula 3}$$

$$\text{arbitrary } \psi).$$

17. The acoustic wave device according to claim 7, wherein the functional electrode includes an upper electrode on one main surface of the piezoelectric layer and a lower electrode on another main surface of the piezoelectric layer.

* * * * *